United States Patent [19]
Lohstroh et al.

[11] 4,126,899
[45] Nov. 21, 1978

[54] JUNCTION FIELD EFFECT TRANSISTOR RANDOM ACCESS MEMORY

[75] Inventors: Jan Lohstroh, Eindhoven, Netherlands; Joannes J. M. Koomen; Roelof H. W. Salters, both of Sunnyvale, Calif.; Cornelis M. Hart, Eindhoven, Netherlands

[73] Assignee: U.S. Philips Corporation, New York, N.Y.

[21] Appl. No.: 814,648

[22] Filed: Jul. 11, 1977

[30] Foreign Application Priority Data

Dec. 17, 1976 [NL] Netherlands .......................... 7613999
Jan. 28, 1977 [NL] Netherlands .......................... 7700880

[51] Int. Cl.$^2$ ............................................. G11C 11/40
[52] U.S. Cl. ................................... 365/182; 307/238; 307/279; 365/184

[58] Field of Search ................. 340/173; 307/238, 279; 365/182, 184, 103

[56] References Cited

U.S. PATENT DOCUMENTS

| | | | |
|---|---|---|---|
| 3,893,151 | 1/1975 | Bosselaar | 340/173 UT |
| 3,893,152 | 1/1975 | Lin | 340/173 UT |

*Primary Examiner*—Terrell W. Fears
*Attorney, Agent, or Firm*—Frank R. Trifari; Jack Oisher; Jerry A. Dinardo

[57] ABSTRACT

A random access memory (RAM) in which each memory cell includes a JFET having two gate electrodes selectable by means of a single word line and a single bit line. The JFETs have a common electrode formed from the substrate of a semiconductor body common to each of the memory cells, which serves as one of the main electrodes of each of the JFETs.

22 Claims, 8 Drawing Figures

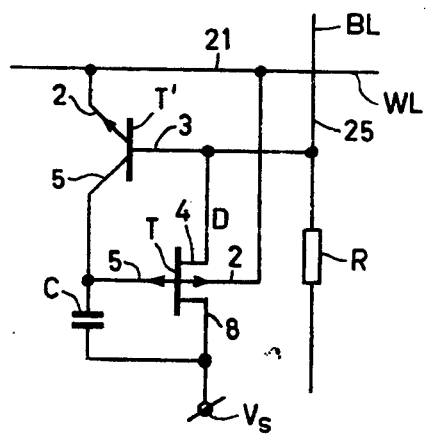
Fig. 3
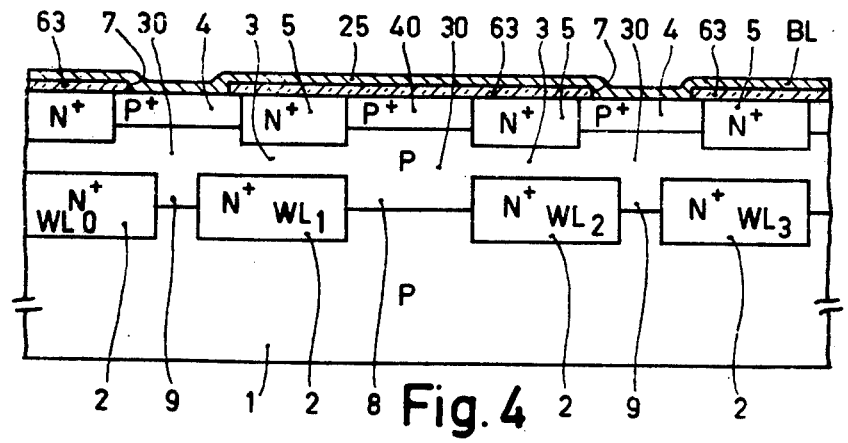
Fig. 4
| Condition | $V_S$ | WL | BL | T | T' | 5 | logic |
|---|---|---|---|---|---|---|---|
| Quiesc. | −10 | 0 | −12 | OFF | OFF | X | X |
| Erase | −10 | +10 | −12 | X | PT | 0 | 0 |
| Write | −10 | −9 | −8,4 | OFF | ON | −9 | 1 |
| Read (1) | −10 | −9 | −12 | ON | OFF | −9 | 1 |
| Read (0) | −10 | −9 | −12 | OFF | OFF | 0 | 0 |
X = don't care
Fig. 5

JUNCTION FIELD EFFECT TRANSISTOR RANDOM ACCESS MEMORY

BACKGROUND OF THE INVENTION

The invention relates to random access memory (RAM), and in particular high density RAMs implemented as integrated circuit semiconductor devices.

Random access memories utilizing junction field effect transistors (JFETs) are known from the International Solid-State Circuits Conference (ISSCC) proceedings, February 1973, pages 34 et seq. The memory cell implementation described in that paper utilizes a JFET in series with a threshold diode, and having three address lines in each cell. The three address lines are a word line, a bit line, and a read line. Such an implementation is an improvement compared with previous RAMs which required four address lines for each cell.

Another implementation of a JFET RAM is described in the IEEE JSSC, August 1976, pages 519. Here again each cell of the memory matrix has three address lines, however the threshold diodes found in the previously discussed implementation have been omitted.

Furthermore, a photo matrix sensor implemented using JFETs is also known. Each of the sensor cells is specified or selected by means of a matrix of word lines and bit lines, and information from the addressed sensor cell is read out indicating the conductivity of the JFET channel existing between a main electrode of the JFET connected to a bit line and the substrate of the semiconductor body in which the sensor is implemented. In such arrangement, each bit line is supplied with a fixed voltage through its own discrete load resistor. Writing information in the sensor cells is achieved by exposing the sensor to the pattern of light and shadow, which represent information. The surface area of cells used in such photo sensors is relatively large, since it is important that the conductor tracks for selecting the memory cells avoid intercepting the light reaching the cells. Such a configuration while uniquely suitable for photo sensors cannot however be used in a high density RAM.

SUMMARY OF THE INVENTION

It is an object of the invention to provide a high-density random access memory using junction field effect transistors as the active storage elements.

It is another object of the invention to provide a random access memory in which only one word line and one bit line are used for each memory cell.

It is still another object of the invention to provide a junction field effect transistor random access memory in which the second main electrode of the memory cell transistor is connected to an electrode common to all the memory cell transistors of the memory.

It is another object of the invention to provide a semi-conductor device in which the substrate cell is connected to the second main electrodes of the active component, the conductivity type of the channels of the memory cell component being the same as the substrate cells, and their gate electrodes being constructed as zones of opposite conductivity type.

It is another object of the invention to provide a JFET memory cell in which one gate electrode of such cell is formed by a buried zone of the opposite conductivity type separated from a surface zone, which is also of opposite conductivity type, by a zone which forms the channel of the JFET.

It is another object of the invention to provide means to selectively erase the information at a gate electrode carrying memory information.

It is another object of the invention to provide an amplifier transistor within a memory cell, so as to be able to read out information from a memory cell in a non-destructive manner (i.e., after completion of the reading out process the information has not been erased but is still available in the cell).

The invention provides a semiconductor device, comprising a plurality of memory cells, each memory cell including one junction field effect transistor implemented on a semiconductor body common to the plurality of cells, and including a channel connected at each end to a main electrode. The conductivity of the channel is controllable by two gate electrodes adjoining the channel and forming a rectifying junction therewith. The invention further provides selection means consisting of a pattern of selection lines including bit lines and word lines. The first main electrode of the memory cell transistor is connected to a corresponding bit line common to a column of transistors, while a first gate electrode is connected to a word line common to a row of transistors, a second gate electrode of such memory cell transistor is then at a floating potential so that the potential represents information under control of the voltages occurring upon selection of a given memory cell transistor. The invention further provides control means for supplying predetermined selection voltages to the word lines and the bit lines for selecting a predetermined memory cell in a manner so that information can be read out of the cell, erased from the cell, and new information written in the cell. In the present invention, the use of field effect transistors having rectifying junctions between the electrodes and the channel enables such an implementation to be done in an efficient manner, and provides the additional benefits that the stored information when read-out is amplified and can be carried out in a non-destructive manner.

It is to be noted that the terms "word line" and "bit line" are used only to indicate to what electrodes of a memory cell transistor they are connected; for selecting a given memory cell, the terms might be interchanged.

The present invention requires only two selection lines for each memory cell, so that the size of the entire integrated circuit memory configuration is reduced considerably over prior art random access memories of MOS technology or other types. The invention further achieves an improvement over prior art memory cells since operation takes place at control voltages such that all memory cells can be selectively written and read out respectively, while erasing information may be done for an entire word line at a time. The control voltages performing these tasks are chosen so that the JFET is used for erasing by means of the punch-through effect.

BRIEF DESCRIPTION OF THE DRAWINGS

FIG. 3 is a schematic diagram of the memory cell of the semiconductor device shown in FIGS. 1 and 2;

FIG. 4 is a diagrammatic cross-sectional view of another embodiment of the invention; and FIG. 5 is a diagram showing the voltage levels for different operative states of the invention.

DESCRIPTION OF THE PREFERRED EMBODIMENT

Figure 1:
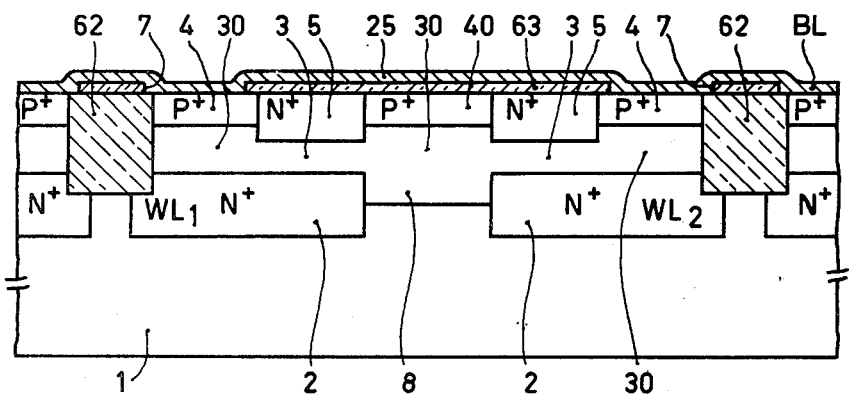
FIG. 1 is a diagrammatic cross-sectional view of a semiconductor device embodying the JFET RAM according to the present invention.

One embodiment of a RAM in accordance with the invention is illustrated in FIG. 1. It comprises a body 1 of, for example, p-type semiconductor material, for example p-type silicon, which serves as a substrate. By the usual masking techniques of photolighography, parallel $n^+$ doped zones 2 are diffused into the substrate (in FIG. 1 normal to the plane of the drawing). A p-type epitaxial layer 30 is then grown over the substrate 1 so that the zones 2 remain in the semiconductor body and form buried $n^+$ zones. At the edge of the semiconductor body, (not shown in FIG. 1) the zones 2 are connected to a conductor track 21, preferably implemented as a metallization on the semiconductor body. The zones 2 are connected to track 21 by means of an $n^+$ diffused zone extending vertically into the body via a window 20, (shown in FIG. 2). The track 21 in turn leads to a control unit L by means of which predetermined selection voltages are applied to the zones 2, which form the word lines WL1, WL2..WLn of the RAM. (The control unit L is shown diagrammatically in FIG. 2 by a block at the edge of the memory array. In large high density memories, additional transistors are required in the control unit, or on either side of one group of memory cells, for reducing the delay time caused by the resistance of the word lines.)

At the surface the epitaxial layer 30 can be doped more heavily by diffusion so that $p^+$ doped zones 40 are formed, after which the $n^+$ doped zones 5 are provided by means of photolithographic methods. The active part of the layer 30 is notably the part 3 between the zones 2 and 5 and the part 8 on one side of the zone 5; the active part of layer 40 is the part 4 on the other side of the zone 5. Each of the structures 2, 3, 4, 5 forms a memory cell, as will be demonstrated hereinafter. Preceding the last-mentioned step for obtaining the zones 5 is a local oxidation step. The local oxidation operation separates the structures 2, 3, 4, 5 from adjacent pairs of structures by forming a deep-vertically extending oxidized zone 61, 62. The zones 61 separate the transistors which are connected to a given bit line BL (to be described hereinafter) from those which are connected to the adjacent bit line. In this manner, adjacent transistors which are connected to different bit lines are interconnected only by their common word line zone 2 and by the substrate of the body 1. The zones 62 (as well as the zones 61) extend down to the word line zones 2 and hence locally interrupt the zones 3 and 4. If necessary, a channel stopper may be provided by a known process near the junction of the oxide zones 61, 62 and the substrate 1. (If desired, the steps to obtain the zones 5 and 61, 62, may be reversed. Instead of the local oxidation step another process for separating the memory cells from each other may also be used, for example, local provision of another dielectric, for example silicon nitride, or the etching away at the area of separation so that a groove, for example a V groove, is formed.)

The semiconductor body is then covered with an insulating layer 63, in particular silicon oxide, in which windows 7 are provided (see FIG. 2), so that the zones 4 are connected to the bit lines BL1, BL2, etc. (extending horizontally in FIGS. 1 and 2). The bit lines lead to another control unit L'. The bit lines are constructed as conductor tracks 25 which cover the underlying zones 4 and 5 and thus shield the zones 4, 5 from incident light).

The operation of the RAM thus obtained will be described in detail with reference to the equivalent circuit diagram shown in FIG. 3.

Each of the structures 2, 3, 4, 5 in FIG. 1 forms a transistor at the crossing of a word line WL and a bit line BL. The transistor is of the form of a p-channel field effect transistor (JFET) whose channel 3 forms rectifying junctions with two gate electrodes (namely 2 and 5). One main electrode of the JFET is formed by the zone 4 connected to the bit line BL, and the other main electrode is formed by the portions 8 of the zone 30 which are connected to the substrate 1. This JFET transistor is represented in FIG. 3 by the symbol T. Associated with this JFET T is a bipolar transistor formed by the zones 2, 3 and 5, in which in particular the zone 2 may serve as the emitter, the zone 3 as the base and the zone 5 as the collector. The bipolar transistor is represented in FIG. 3 by the symbol T'. It is to be noted that the zones 5 are not connected directly to any control line and are therefore at a floating potential. The capacitance which each of the zones 5 forms with respect to the substrate is indicated by the representative element C in FIG. 3.

Figure 2:
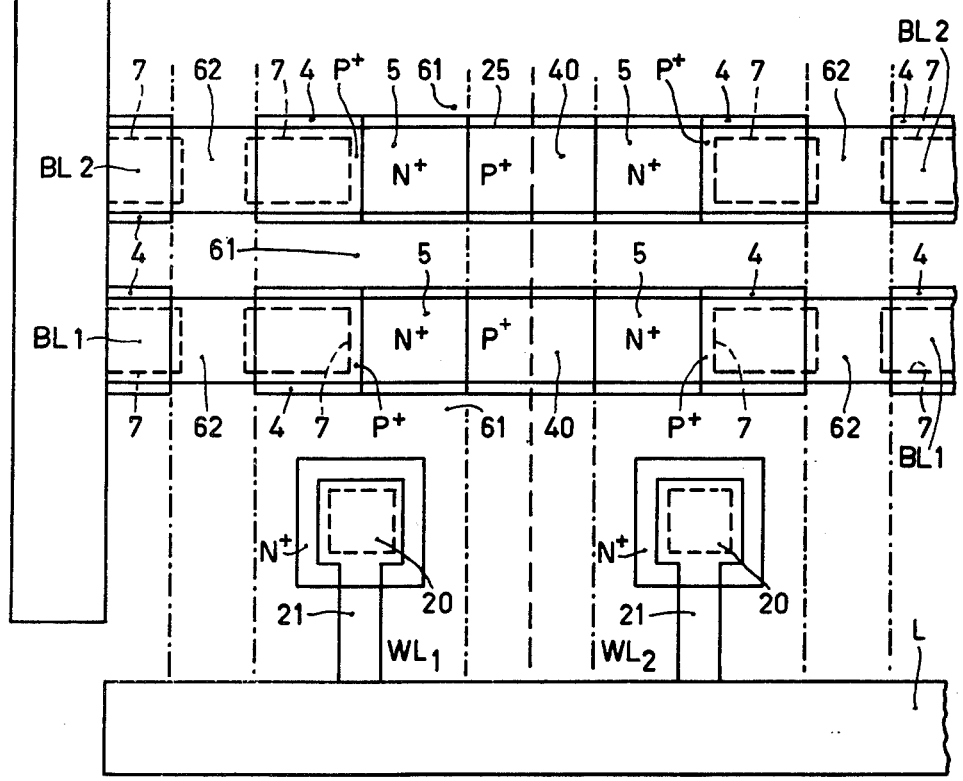
FIG. 2 is a diagrammatic top plan view of the device shown in FIG. 1.

During operation, the following operating conditions are created by the control unit L (FIG. 2). Assume the substrate to be, for example, at a voltage Vs of $-10$ Volts.

In the quiescent mode, for example, a voltage of 0 Volts is provided at the word lines WL and a voltage of $-12$ Volts is provided at the bit lines BL. In this mode, the transistors connected to the word lines and the bit lines, respectively, are all pinched-off and hence nonconductive.

In the erase mode (i.e., to erase the information possibly present in a column of transistors connected to a given word line stored as a charge on capacitor C) a positive voltage (for example $+10$ Volts) is applied to the relevant word line by means of the control logic L. The voltage is selected to be sufficiently high so that punch-through is produced between the emitter 2 and the collector 5 of transistor T', charging the capacitor to 20 Volts which causes the stored information to disappear (as will be described hereinafter).

In the write mode, the control unit L applies a negative voltage (for example $-9$ Volts) to a given selected word line, for example WL1, and a slightly less negative voltage (for example $-8.4$ Volts) to the associated bit line. The bipolar transistor T' in FIG. 3 thereby becomes conductive. As a result of this, the collector of said transistor T' (i.e., zone 5) will assume a voltage which is substantially equal to that of its emitter. In the given numerical example the voltage would be $-9$ Volts, which will be thus defined as a logic level 1. The charge associated with the voltage of $-9$ Volts is maintained since zone 5 is constructed as a floating zone. (Insofar as the stray capacitance C of zone 5 should be too small for certain purposes, it might be increased by certain technological measures, for example, by increasing the doping and/or the surface area.)

In the read-out mode, a negative voltage for example $-9$ Volts) is applied to the associated word line, and likewise a negative voltage (for example $-12$ Volts) is applied to the associated bit line by the control logic L. The voltage difference occurring between the word line zone 2 and the channel zone 3 is so small that the depletion region which penetrates into zone 3 starting from zone 2 is still so small that as a result of this only the channel of the JFET is not pinched-off. If the floating zone 5 is at a negative potential, that is if indeed a logic 1 has been written in that zone, then the voltage operative between the zones 5 and 3 in the reverse direction will be too small to pinch off the channel of the JFET formed by the zone 3. In other words: current can flow between the zones 4 and 1 and can be converted into a relevant output voltage, for example, by means of a resistor R incorporated in the relevant bit line. If, on the contrary, no information had been written in the zone 5 (i.e. logic 0), then the zone 5 is substantially at a voltage = 0 Volt (as will be demonstrated hereinafter). The differential voltage between the zones 5 and 3 operative in the reverse direction is then so large that the depletion region produced thereby in the channel zone 3 causes the channel of the JFET to be pinched off.

In the above-selected example, the voltage of the bit line is assumed to be more negative ($-12$ V) than the substrate voltage ($-10$ V), so that during a reading operation the JFET is operated with drain electrode output. If the bit line voltage is chosen to be less negative than the substrate voltage, the zone 1 of the JFET will serve as drain, and the zone 4 as source (source follower).

The above-described erasing mode by punch-through occurs as follows: during erasing, a sufficiently large voltage difference exists between the word line zone 2 ($+10$V) and the channel zone 3 ($-10$ V), so that the depletion region penetrates into the channel zone, and reaches the zone 5. The charge carriers (electrons) emerge directly from the zone 5 and reach the zone 2 via the zone 3. Consequently, the potential of the zone 5 increases so that, if zone 5 originally was at a potential associated with a logic 1 ($-9$ V), the potential increases. Such an increase continues up to the then-occurring voltage difference, so the then-occurring electrical field between the floating zone 5 and the word line zone 2 ($+10$ V) has decreased to such an extent that charge transfer discontinues. It has been observed that the zone 5 ultimately assumes a voltage equal to the voltage applied to the word line zone 2 (during erasing), decreased by an amount equal to the punch-through voltage necessary to punch-through the entire channel zone 3 from zone 2 to zone 5.

In the selected numerical example above, the value 10 V has been assumed for the two voltages, so that the zone 5 is consequently brought at 0 V. (When said zone 5 was already at 0 V, which corresponds to a logic 0, no punch-through will occur, of course.) When the erasing voltage on the word line 2 would deviate slightly from the punch-through voltage, a slightly different quiescent voltage will remain on the zone 5 which in practice, however, may be small enough to distinguish clearly from a written logic information ($-9$ V).

The applied voltage and resultant circuit conditions are summarized in a Table depicted in FIG. 5. The $x$ indicates a "don't care" condition.

In the preceding description there has been thought in the first instance of logic information according to the binary numeration — in the numerical example chosen the logic 1 is characterized by $-9$ V at the floating zone 5, the logic 0 in that zone 5 is at 0 V. It will be obvious, however, that, if during writing a variable voltage is presented to the word line WL, a variable voltage can also be impressed upon the floating zone 5 so that analog information can be written. Upon reading, the channel width of the JFET will in these circumstances vary accordingly, so that analog read-out current is formed.

It will be obvious from FIGS. 1 and 2 that as a result of the chosen construction a semiconductor device for a RAM can be obtained of a very compact structure. Of particular value is that only one system of word lines and one system of bit lines are necessary, which involves a considerable space-saving on the semiconductor body. Furthermore, the fact that the zones 4 and 5 directly adjoin each other has an extremely space-saving effect, while for the manufacture as described above a small number of masks is necessary. It is to be noted that mask alignment problems are minimized, since, not counting the provision of contact windows and conductor tracks, attention for the alignment need be paid only to accuracy in providing the zones 5 and this only in one direction (horizontal direction in FIG. 1), since in the direction normal thereto the local oxide zone 61 ensures a separation between adjacent memory cell pairs (for example those connected to BL1 and BL2, respectively, in FIG. 2). Finally it is pointed out that, by constructing the transistor structures 2, 3, 4, 5 symmetrically in pairs and separating them pair wise by oxide zones 62, a further space-saving is obtained because the same part 8 of the zone 30 can simultaneously serve as the main electrode for the JFET shown on the left-hand side of said part 8 and for that shown on the right-hand side of said part 8. This has been made possible because in the operating conditions chosen, said two structures do not influence each other.

A further technological simplification and space gain is demonstrated in FIG. 4 in which the local oxidation step between cell pairs which are connected to the same bit line has been omitted so that only local zones (as parallel horizontal zones corresponding to the zones 61 in FIG. 2) remain between the memory cells connected to different bit lines, which local oxide zones can be obtained again by means of a photolithographic method without a critical alignment process. The construction of the structures 2, 3, 4, 5 is again quite the same as that of FIG. 1 and can be obtained with the same technological manufacturing steps. So this structure again forms similar memory cell transistor structures as described with reference to FIG. 1, in which the momory cells connected to the same bit line are constructed symmetrically and are situated immediately beside each other. Not only does this result in space saving, because the word line zones 2 can be situated closer beside each other at the area 9, but in particular said word line zones 2 need be much less wide because the oppositely located $p^+$ zones 4 need not be wider than is necessary for the provision of a contact window. As is shown in FIG. 4, this width of zone 2 is smaller than that of the floating zone 5 increased by half of that of the zone 4.

This circuit simplification and increased density is based upon the recognition of the fact that it is possible to provide juxtaposed memory cell structures at a predetermined distance apart so that only a first portion 8 of the substrate 1 serves as one main electrode for the JFET structures 2, 3, 4, 5 situated on either side of the first portion while in the region of the second portion 9 of the substrate 1 and the layer 30 the word line zones 2 are so close together so that, together with the portion 9, they serve as a vertical JFET of which the channel (i.e., the portion 9 of zones 30 and 1) is continuously pinched-off as a result of the reverse voltages prevailing between the substrate and the word lines, so that consequently those operating conditions prevail that no current can flow there. Thus, adjacent word lines WL0 and WL1 and WL2 and WL3, of different cells are isolated by a depletion field in separating regions during operation.

Normally, a voltage operative in the reverse direction is always present between the substrate 1 and the word lines WL1, WL2, WL3, so that charge depletion occurs in the portions 9. If we assume that the substrate voltage is, $-10$ V, the voltage at a word line is either $-9$ V, or 0 V, or $+10$ V. Under these circumstances, the portions 9 serve as the channel of a vertical JFET of which the word lines zones (for example WL2 and WL3) serve as the gate electrodes and of which the main electrodes are formed by the substrate 1, and the $p^+$ zones 4 connected to the bit line BL. At the voltages chosen, with an appropriate doping of the substrate 1 and/or the zone 30, and with a correct mutual distance between the word line zones WL2 and WL3, respectively, the vertical JFETs are pinched-off and consequently pass no current. On the other hand, the distance and doping profile should be chosen to be so that no pinch-through can occur, or at least chosen so that a possibly occurring punch-through effect has no detrimental results. If the control means L are designed so that an erasing voltage is not applied to one word line at the same time as a writing or reading voltage is applied to the adjacent word line, then with the numerical example chosen, the voltage difference occurring between two juxtaposed word line zones WL2, WL3 is never larger than 10 V, so that an undesired punch-through effect is easily prevented. Furthermore, in the region of the portion 8 the word line zones (for example WL1 and WL2) should be spaced apart to such an extent so that, at least during reading, the current path is not pinched-off. By choosing the distance between juxtaposed word line zones in the portion 8 to be considerably larger than in the portion 9, this requirement can easily be fulfilled. If necessary, it can be achieved by a preceding diffusion step, so that the doping of the zones 1 and 30 in the portion 8 is higher than in the portion 9.

Figure 6:
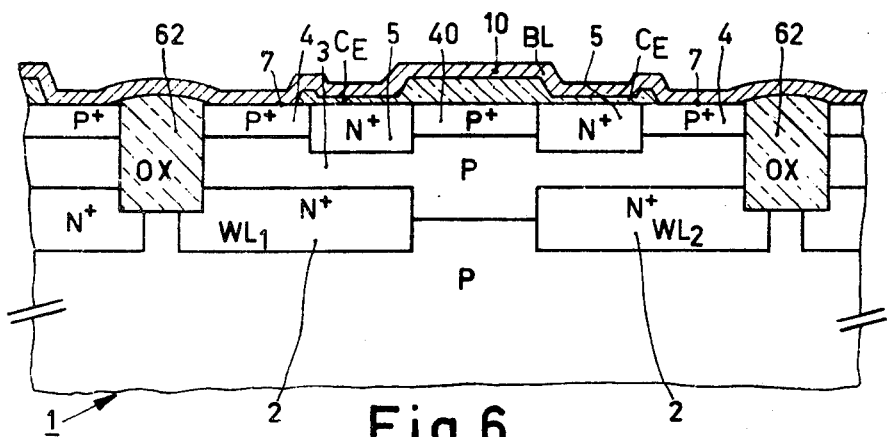
FIG. 6 is a diagrammatic cross-sectional view of still another embodiment of the invention and FIG. 7 shows the electric equivalent circuit diagram of a memory cell according to the semiconductor device of FIG. 6.

With the memory devices described thus far it is not possible to selectively erase the information in one memory cell; during the erasing process the logic information possibly present in all transistors belonging to the relevant word line is erased collectively. The embodiment shown in FIG. 6 is a modified embodiment of that shown in FIG. 1 with which the possibility is created to selectively erase the information in a given memory cell.

Figure 7:
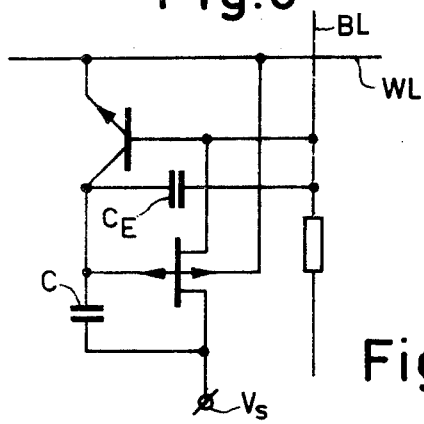

The construction of the substrate 1, the word line zones 2, the epitaxial layers 3 and 4 and the floating zones 5 is again quite the same as that shown in FIGS. 1 and 2. The local oxidation zones 62 may also be the same as in FIG. 1, or the same principle of pinched-off vertical JFET's may again be followed, as described with reference to FIG. 4. The bit lines BL which lead to the zones 4, however, are now constructed as a conductor track 10 (shown shaded) which has intentionally been provided at the area of the zones 5 so closely in the proximity of said zones 5 that a considerable capacitive coupling is obtained between the relevant bit line and the zones 5. This capacity is denoted in FIG. 6 and in the equivalent circuit diagram shown in FIG. 7 by $C_E$.

The operation is as follows: the writing and reading process is quite the same as described with reference to FIG. 1. However, erasing occurs by capacitively transferring a part of the required differential voltage between the word line and the floating zone 5 to be erased to said zone by means of the associated bit line. The natural capacity C which the zone 5 shows with respect to the substrate should previously be taken into account as a result of which a voltage pulse applied to a bit line BL only partly reaches the zone 5 as a result of capacitive division.

Figure 8:
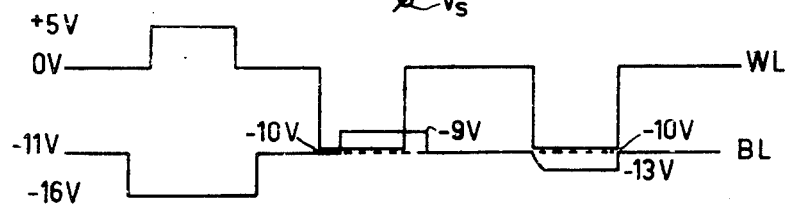
FIG. 8 shows the various voltages occurring in various operating conditions.
Figure 8:
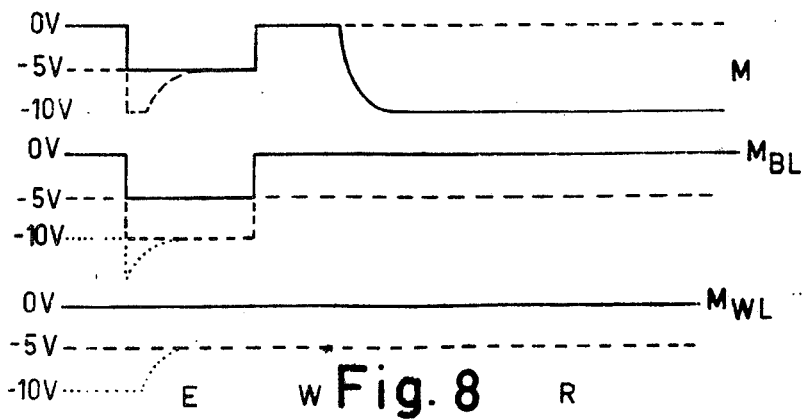

FIG. 8 shows the various operating conditions for controlling a RAM as shown in FIG. 5. Three conditions are to be considered, namely the erasing condition E, the writing condition W and the reading condition R. FIG. 8 shows various voltages occurring during said operating conditions at the word line WL, the bitline BL and the floating (memory) zone 5(M). As an example there is started again from a punch-through voltage for penetrating the channel 3 of 10 V. The substrate voltage has been assumed to be $-13$ V.

In the numerical example incorporated in FIG. 8, the writing (W) of a logic 1 occurs in that the bit line voltage ($-9$ V) becomes positive with respect to the wordline voltage ($-10$ V), while reading occurs at $-10$ V word line voltage, after which the bit line voltage decreases in accordance with the information at zone 5, which corresponds more or less to the numerical example shown in FIGS. 1 and 2. For erasing (condition E), however, a considerably less high positive voltage, namely $+5$ V, is applied to the word line WL, while simultaneously the bit line voltage jumps from $-11$ to $-16$ V. When $C_E$ is assumed to be large with respect to C, the voltage M of the floating zone 5 will follow said jump entirely; when this condition is not satisfied, the result will be a slightly smaller voltage step of M. When the voltage of zone 5 was originally 0 V (logic 0), the voltage difference during the condition E between word line WL and zone 5(M) will be just 10 V and no punch-through will occur; however, when the zone 5 comprises logic information (for example $-5$ V as shown in broken lines in voltage diagram M), the voltage difference between WL and M increases to above the punch-through voltage of 10 V, so that said difference is reduced to 10 V by punch-through and the information is erased.

As regards the other transistors connected to the relevent word line and bit line, respectively, (voltage diagram $M_{WL}$) and $M_{BL}$, respectively, in FIG. 8), if logic information was present therein (broken line in said diagrams), said information will be reduced to approximately $-5$ V, in other words the logic swing becomes only half of that which was possible according to the preceding memory devices. In practice, however, said swing is generally amply sufficient to be distinguished from the condition in which no logic information was present in the relevant zone 5.

A process on which the desired capacitances $C_E$ can be created in a simple manner may consist in that, after in-diffusion of the zones 5, the same mask is used for said local in-diffusion to provide a thin insulation layer (for example of silicon oxide or silicon nitride) at the area of said zones 5. Windows, analogous to the windows 7 in FIG. 2, are then again etched through said insulating layer and the mask together, after which the assembly is provided with the conductor tracks BL which then assume the shape as shown in FIG. 6. At the area of the windows 7, contact is made to the zones 4 which on the one hand serve as one of the main electrodes of the JFET (the other main electrode is formed by the substrate 1), and on the other hand as the base electrode of the junction transistor formed by the zones 2, 3 and 5. In the proximity of the zones 5, the conductor track BL approaches said zones so closely that the relevant capacitance $C_E$ is formed, while the insulation caused by the mask used for the in-diffusion and the said insulation layer at the area 10 between every two memory cell transistors is so large that undesired reaction of the bit voltage on the underlying P+ zone 40 is prevented.

It will be obvious that many variations are possible to those skilled in the art without departing from the scope of this invention. For example, the conductivity type of all the semiconductor zones can be reversed while also reversing the polarity of the voltages used. Furthermore, the control logic L (FIG. 2) and the memory cells may be implemented on separate parts of one semiconductor body, in which differently doped zones (substrate zones) are provided in the semiconductor body and extend only down to a predetermined depth within the substrate, in which one part supports the memory cells and the other part supports the control logic. The starting material may be, for example, an n-type conductivity body in which a substrate zone of p-type conductivity is locally provided after which the further above-described steps may be carried out, while the control means L and/or further peripheral apparatus may be provided on the remaining (n-doped) part of the body.

Furthermore, instead of diffused zones, ion implantation may be used. The zones 5 may, in principle, be constructed with the zone 3 as Schottky diodes. For adapting the word line voltage level to the actually occuring punch-through voltage, an auxiliary zone may be provided above the word line zone 2 in a similar way as the zones 5 and in the proximity of the control logic L. The voltage on such an auxiliary zone tends to become positive as soon as during erasing (this is the case when the word line voltage becomes larger than the actually occurring punch-through voltage), and a limiter is actuated to restrict the word line voltage to this level.

The packing density which can be achieved with a RAM according to the invention is very considerable. Since the alignment difficulties of photomasks for making the various zones have been minimized, zones of very small dimensions can be used. Therefore, the extent of the zones 4 and 5 will preferably be chosen to be equally small, as shown in FIGS. 1, 2 and 4, i.e. so small as is achievable within the present technical tolerances. In principle, it is also possible to construct the information carrying zones (e.g. 5 in the Figures) as floating buried zones, and to implement the word line zones at the surface of the semiconductor body. In general such an implementation may lead to slightly smaller leakage currents of the floating zones, however the drawback of this implementation is that the word line zones at the surface would have to cross the oxide zones 61 (FIG. 2); consequently such a word line must be divided into separate word line zones in each cell which are connected together by a separate conductor track; this conductor track then requires for each word line zone a relevant contact hole, and thus more space and doublelayer wiring.

What is claimed is:

1. A semiconductor device for a random access memory (RAM) comprising a plurality of memory cells arranged in rows and columns in a semiconductor body and each comprising one junction field effect transistor spaced apart having source and drain main electrodes, a channel extending between and connecting said source and drain main electrodes and two gate electrodes adjoining the channel, each of said gate electrodes forming a rectifying junction with said channel for controlling the conductivity of the channel;

selection means comprising selection lines, including one bit line and one word line for each memory cell, a first main electrode of a memory cell transistor being connected to a respective bit line common to a column of transistors, and a first gate electrode being connected to a word line common to a row of transistors, a second gate electrode of such memory cell transistor being at a floating potential, which represents information under the control of the voltages used for selection of said memory cell transistors; and control means for supplying selection voltages to the word lines and bit lines for selecting said memory cell transistor to selectively perform, one at a time, the functions of erasing information contained in said selected transistor, writing new information into said selected transistor, and reading out information from said selected transistor, depending upon the voltage levels on the word lines and bit lines, the second main electrode of said transistor being connected to an electrode common to the memory cell transistors.

2. A device as claimed in claim 1, wherein the semiconductor body comprises a substrate zone of one conductivity type, which supports the memory cell transistors and is connected to the second main electrodes thereof, the conductivity type of the channels of the memory cell transistors being the same as that of the said substrate zone, their gate electrodes being constructed as zones of the opposite conductivity type.

3. A device as claimed in claim 2, wherein said first gate electrodes of the transistors of a row are constructed as a word line zone of said opposite conductivity type which is common to the row and which forms a word line of the RAM.

4. A device as claimed in claim 3, wherein a common word line zone is constructed as a buried zone which is situated between the channels of a row of transistors and the substrate zone.

5. A device as claimed in claim 4, wherein said second gate electrodes are constructed as floating surface zones of the semiconductor body of the opposite conductivity type placed opposite to the word line zones and separated therefrom by the channels.

6. A device as claimed in claim 5, wherein said second gate electrodes of the semiconductor body directly adjoin surface zones of the one conductivity type belonging to the main electrodes and of a higher doping than the channel between the floating zone and the buried zone.

7. A device as claimed in claim 5, wherein the bit lines are constructed as conductor tracks extending over said floating zones and substantially covering said zones.

8. A device as claimed in claim 5, wherein successive transistors of a column form pairwise symmetrical replicas of each other.

9. A device as claimed in claim 6, wherein both the first and the second main electrode of a transistor comprises a surface zone which adjoins its second gate electrode and which is of a higher doping than the channel zone and wherein said more highly doped zone is connected to the first main electrode and, after interruption by the zone of the second gate electrode, continues as a zone which is not connected to said first main electrode.

10. A device as claimed in claim 8, characterized in that the transistors belonging to a column are divided into pairs of successive transistors, the second main electrodes of each pair having a common semiconductor part which extends between the substrate zone and the surface of the semiconductor body.

11. A device as claimed in claim 2, characterized in that two juxtaposed columns of transistors are separated from each other by a separation zone of electrically insulating material provided in the semiconductor body.

12. A device as claimed in claim 11, characterized in that a separation zone of silicon oxide is used.

13. A device as claimed in claim 11, characterized in that the separation zone comprises a groove provided in the semiconductor body.

14. A device as claimed in claim 11, characterized in that such a separation zone is also provided between successive pairs in a column of transistors.

15. A device as claimed in claim 5, characterized in that the bit line associated with a memory cell transistor is coupled capacitively to the zone of the said second gate electrode so as to be able to selectively erase the information in said gate electrode.

16. A device as claimed in claim 15, characterized in that the relevant bit line is provided over the relevant column of transistors as a conductor track separated from the zone of the said second gate electrode by a thin dielectric insulation.

17. A device as claimed in claim 6, characterized in that the extent of each of the buried zones constituting the word line zones and measured in the direction of the bit lines is substantially equal to the combined extent of the two other oppositely located surface zones constituting the second gate electrode and one adjoining main electrode.

18. A device as claimed in claim 17, characterized in that the said two adjoining surface zones each have approximately the same dimensions.

19. A device as claimed in claim 10, characterized in that two successive transistors of a column which belong to different pairs, have first main electrodes comprising a common semiconductor part, which part is connected to the relevant bit line, and buried gate electrodes which are positioned so close adjacent each other that in operating conditions the region which is situated between the buried gate electrodes and connects the first main electrodes to the substrate zone is pinched off by field effect.

20. A device as claimed in claim 19, characterized in that the dimension of the buried first gate electrode zones measured in the direction of the bit lines is smaller than that of the oppositely located second gate electrode zone increased by half of the distance between two second gate electrode zones.

21. A device as claimed in claim 1, characterized in that by means of the control means
during quiescent condition the voltage on the word line and bit line ensures that the current in the relevant memory cell transistor is negligible,
during writing information via word line and bit line a forward voltage may be made operative across the junction between the first gate electrode and the first main electrode so that said two electrodes, together with the second gate electrode, may receive information,
during the reading a voltage is applied to the word line with respect to the voltage at the second main electrode which operates the associated junction slightly in the reverse direction while a voltage which differs from that at the second main electrode is presented to the first main electrode so that therewith the conductivity of the channel of the JFET which is mainly controlled by the voltage at the second gate electrode can be measured, and
during erasing such a high voltage with respect to the second main electrode and operative in the reverse direction is applied to the first gate electrode connected to the word line that as a result of this a charge depletion layer is produced in the channel of the JFET which penetrates this channel and reaches the zone of the second gate electrode and reduces the potential thereof to a previously determined level as a result of punch-through.

22. A device as claimed in claim 21, characterized in that a part of the punch-through voltage required for erasing is applied capacitively to the zone of the second gate electrode as a voltage pulse applied to the bit line.

* * * * *